(12) United States Patent
Larsson et al.

(10) Patent No.: US 8,952,643 B2
(45) Date of Patent: Feb. 10, 2015

(54) METHOD AND CIRCUIT ASSEMBLY FOR CURRENT CONTROL IN 3-PHASE MOTORS

(75) Inventors: Lars Larsson, Hamburg (DE); Bernhard Dwersteg, Hamburg (DE)

(73) Assignee: Trinamic Motion Control GmbH & Co. KG, Hamburg (DE)

( * ) Notice: Subject to any disclaimer, the term of this patent is extended or adjusted under 35 U.S.C. 154(b) by 165 days.

(21) Appl. No.: 13/810,635

(22) PCT Filed: Jul. 18, 2011

(86) PCT No.: PCT/DE2011/075171
§ 371 (c)(1), (2), (4) Date: Jan. 16, 2013

(87) PCT Pub. No.: WO2012/010169
PCT Pub. Date: Jan. 26, 2012

(65) Prior Publication Data
US 2013/0119914 A1    May 16, 2013

(30) Foreign Application Priority Data
Jul. 17, 2010 (DE) .......................... 10 2010 036 473

(51) Int. Cl.
| H02P 1/32 | (2006.01) |
| H02P 3/20 | (2006.01) |
| H02P 7/06 | (2006.01) |
| H02P 25/22 | (2006.01) |
| G01R 19/25 | (2006.01) |
| H02P 8/12 | (2006.01) |

(52) U.S. Cl.
CPC ............ *H02P 25/22* (2013.01); *G01R 19/2509* (2013.01); *H02P 8/12* (2013.01)

USPC .......................................................... 318/496

(58) Field of Classification Search
CPC .................................................. G01R 19/2509
USPC .......................................................... 318/496
See application file for complete search history.

(56) References Cited

U.S. PATENT DOCUMENTS

| 5,341,076 | A  | * | 8/1994  | Bahn ..................... 318/400.31 |
| 6,137,248 | A  | * | 10/2000 | Kalpathi ................. 318/400.07 |
| 6,208,107 | B1 | * | 3/2001  | Maske et al. ................. 318/685 |
| 6,285,155 | B1 | * | 9/2001  | Maske et al. ................. 318/685 |
| 7,909,008 | B2 | * | 3/2011  | Inoue et al. ................ 123/90.17 |

FOREIGN PATENT DOCUMENTS

| DE | 20305771 U1 | 7/2003 |
| DE | 102007040166 A1 | 6/2009 |

OTHER PUBLICATIONS

German Official Action (Jul. 15, 2011) from corresponding German Application DE 10 2010 036 473.8.

* cited by examiner

*Primary Examiner* — Erick Glass
(74) *Attorney, Agent, or Firm* — WRB-IP LLP

(57) ABSTRACT

A method and circuit assembly are provided for controlling the motor current in an electric 3-phase motor, in particular in a 3-phase stepper motor, by a chopper process. For at least two of the three motor connections a respective chopper phase is cyclically activated, while a target motor current supplied for the motor connection in question is injected into the motor connection by a chopper process, while the two other motor connections are connected to each other.

13 Claims, 4 Drawing Sheets

METHOD AND CIRCUIT ASSEMBLY FOR CURRENT CONTROL IN 3-PHASE MOTORS

BACKGROUND AND SUMMARY

The invention relates to a method and a circuit assembly for controlling motor current in an electric motor with three or more phases, especially a stepper motor with three or more phases, by means of a chopper process.

With 2-phase motors, and especially 2-phase stepper motors, it is known by means of a chopper process from an added motor supply voltage for each of the two motor coils to generate current direction, current amplitude and current form to be injected (in a microstep operation normally a sine or cosine form) according to a current preset (coil target current) to thus drive the rotor of the motor by means of PWM current pulses.

With this three different coil current phases are distinguished, which are activated via the chopper process:

In the ON-phase, the coil current is driven into a coil in the direction of the instantaneous preset polarity or direction of the coil current actively via the coil, so that the amount of the coil current rises relatively quickly and continuously (switch-on period). The coil current direction injected through an ON phase is thus equal to the instantaneous polarity or direction of the coil current.

In the case of as sine-wave coil current, the coil current is for example positive in the first and second quadrants and negative in the third and fourth quadrants.

In the fast decay (FD) phase, the coil current is actively decomposed against the just-preset polarity of the coil current through reversal of the coil pole and feedback of the coil current, i.e., the coil current direction is set opposite to the polarity of the coil current. Especially in the phases of falling coil current amount (i.e., during the second and fourth quadrant of a sine wave shaped coil current), the FD phase serves for decomposing the coil current relatively quickly and to prevent the current preset from being adulterated especially via the counterelectromotive forces.

Designated as the third coil current phase of the chopper operation is the recirculation phase or slow decay (SD) phase, in which the coil is not actively controlled but rather short-circuited or bridged, so that the coil current, due to the inner resistance of the coil and the counter-EMF, drops off only gradually (i.e., slower than during the FD phases) in terms of amount.

These three coil current phases are temporally activated, determined and combined by the chopper process so that the de facto coil current over its entire (for example, sine-wave shaped) course, thus during, the rising and the falling current phases, follows a current preset (coil target current) as temporally close and precisely as possible, and especially is not (substantially) altered through the voltage (counter-EMF) counter-induced through the rotor in the motor coils. For this it is required to measure or to determine the de facto current through each of the two coils in a suitable manner.

However, in contrast to 2-phase stepper motors, with 3-phase stepper motors, control of the individual motor coils, each offset by 120° spatially in relation to the rotor in a manner electrically uncoupled from each other, is not possible (with only DE 10 2007 040 166 as an exception), since within the motor they are connected with each other in a triangular or star connection or otherwise, and thus not all (total of six) connections of all (three) coils can be guided outwards in a manner electrically insulated from each other. 3-phase stepped motors therefore are normally guided by a controlled chopper, which impinges on the three outer connections U, V, W of the motor that are available with PWM current pulses that are offset to each other as regards their phase by 120°, as is known in similar fashion for controlling 3-phase BLDC motors.

With such control, the individual coils of the motor then see an effective control voltage which corresponds to the difference between the temporal durations of the particular PWM current pattern at the two connections of the pertinent motor coil. Thus the motor is controlled with an effective control voltage and by this means can be rotated very precisely in the low speed range. For this purpose, the PWM current pulses are sine-wave modulated, so that a sine-wave current progression is generated in the motor coils, i.e., in the three connections U, V and W of the motor, currents are fed in that have a sine-wave shape and exhibit the phases $\sin(x)$, $\sin(x+120°)$ and $\sin(x-120°)$ relative to each other.

However, it has been shown that the motor sometimes exhibits very rough running as soon as the r.p.m. of the motor during such operation comes close to the mechanical (natural) resonant frequency of the motor. Evidently one substantial cause is that the counter-EMF of the motor that arises through the resonances and is no longer sine-wave-shaped, can come into the order of magnitude of the control voltages on the motor coils and partially cancel them. This counter-EMF arising through the resonance-caused oscillations is subtracted from the control voltages, so that the resulting coil currents can vary substantially from the sine-wave progression necessary for an optimal motor operation. Since the rotor of the motor is controlled by the magnetic fields and thus by the coil currents, it can in turn no longer follow the preset sine-wave-shaped control voltages with sufficient precision.

It is in fact conceivable by means of a regulating device such as a PID regulator to readjust the control voltages on the motor coils in dependence on the counter-EMF, so that the coil currents remain as close to sine-wave-shaped as possible. However, in addition to higher circuit costs and its greater complexity, use of such a higher-order controller has a disadvantage in that it is critical to set parameters for the controller, and if necessary, motor-specific parameters are required or are dependent on it.

It is desirable to provide a method and a circuit assembly for controlling the motor current in an electrical 3-phase motor, especially a 3-phase stepper motor, by which the above-mentioned disadvantages are avoided, and especially not requiring a higher-order controller for the above-mentioned purpose.

It is also desirable to provide a method and a circuit assembly for controlling the motor current in an electrical 3-phase motor, especially a 3-phase stepper motor, by which the motor runs smoothly, even at higher and high motor r.p.m. with relatively low additional circuit complexity.

According to an aspect of the invention, a method is provided for controlling the motor current in an electrical 3-phase motor, especially a 3-phase stepper motor, with a first, a second and a third motor connection, wherein a first, a second and a third chopper phase are activated in cyclically alternating fashion, during each of which the motor is connected between a supply voltage and ground, namely, on the one hand by means of one of the first, the second and the third motor connection and on the other hand by means of the two other of the first, the second, and the third motor connections, wherein the latter are connected with each other, and wherein during at least two of these three chopper phases, a target current supplied for the affected one of the first, the second, and the third motor connection is injected into this one motor connection by means of a chopper process.

According to another aspect of the invention, a circuit assembly is provided for controlling the motor current in an electrical 3-phase motor, especially a 3-phase stepper motor, with a first, a second and a third motor connection, which circuit assembly exhibits a driver circuit (DR) controlled by a chopper (CH), and by which circuit assembly a cyclic alternating switching takes place between at least two chopper phases, wherein during each chopper phase into each one of the motor connections, by means of a chopper process, a motor current is injected which corresponds to a fed motor target current for this motor connection, wherein the two other motor connections are connected with each other via the driver circuit (DR).

With the invention-specific method and the invention-specific circuit assembly, robust and simple control of motor currents is possible, and due to constant current operation, motor natural resonances can be efficiently dampened.

Due to the simplicity of the method, expense for digital switching elements and components for signal detection is relatively low.

Therefore, the invention-specific circuit assembly is suitable for integration especially in such integrated circuits as must employ high-voltage technologies to make possible direct control of motors or of power transistors which in turn control a motor. Due to their great structural width, such integrated circuits have only limited possibilities for economical integration of large digital components. Thus, a suitable complete module can be implemented for mass production as well.

BRIEF DESCRIPTION OF THE DRAWINGS

Additional particulars, features and advantages of the invention are derived from the following specification of preferred, exemplary embodiments, with the aid of the drawings. Shown are.

DETAILED DESCRIPTION

Figure 1A:
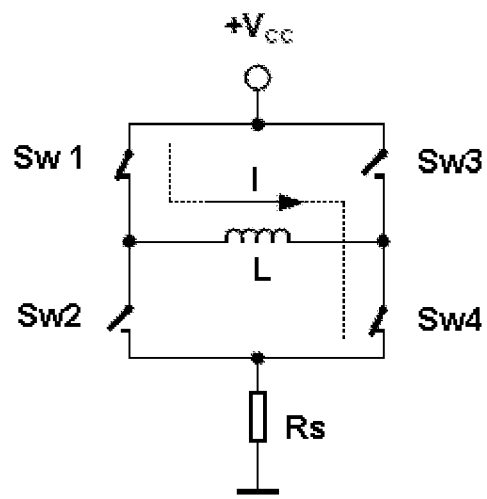
FIG. 1 Circuit diagrams with various coil current phases in a motor coil during the chopper operation FIG. 2 Circuit diagrams of various chopper phases for cyclic control of the motor coils according to the invention FIG. 3 a depiction of measured coil current progressions with distortions FIG. 4 a depiction of measured coil current progressions while employing a hysteresis FIG. 5 a general circuit diagram of a stepper motor control unit with components for carrying out the invention-specific method.
Figure 1B:
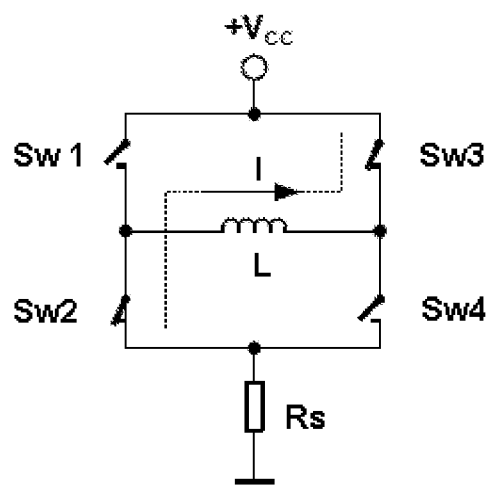
Figure 1C:
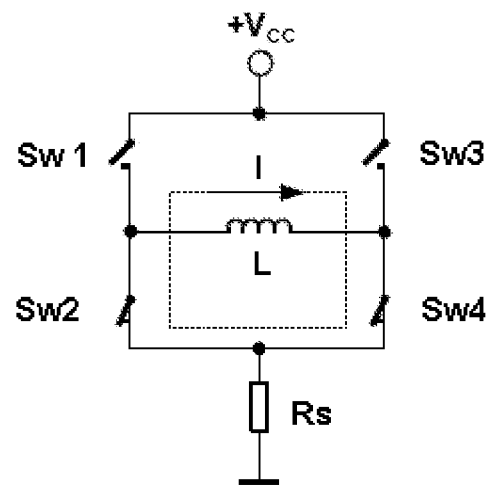

First the three current control phases named at the outset for one of the motor coils will be explained in greater detail. The three coil current phases are schematically shown in FIG. 1(A), FIG. 1(B) and FIG. 1(C). Each of these three figures shows a bridge circuit consisting of or comprising a first to fourth switch Sw1, Sw2, Sw3, Sw4, wherein a first and a second switch Sw1, Sw2 as well as a third and a fourth switch Sw3, Sw4 are switched in series and the two series circuits are connected parallel with each other. The motor coil L is connected with the center points of the bridge branches. The foot of the bridge circuit typically is connected via a measuring resistor Rs for measuring the de facto coil current to ground, while the head of the bridge circuit is attached to a voltage or current supply Vcc.

FIG. 1(A) shows the switching settings and the direction of current flow I resulting therefrom through coil L during the above-mentioned first coil current phase (ON phase), in which this direction is the same as that of the preset direction and polarity of the coil current, with the first and fourth switch Sw1, Sw4 closed and the second and third switch Sw2, Sw3 open.

FIG. 1(B) shows the switching settings and the polarity reversal resulting therefrom of coil L as well as the feedback of coil current I into the voltage supply Vcc, i.e., against the preset direction and polarity of the coil current (here the same as in FIG. 1(A)), during the above-mentioned second coil current phase or fast decay (FD) phase, in which the first and the fourth switch Sw1, Sw4 are open and the second and the third switches Sw2, Sw3 are closed.

Finally, FIG. 1(C) shows the third coil current phase or slow decay (SD) phase, in which the coil L is short-circuited or bridged, i.e., the second and the fourth switch Sw2, Sw4 are closed, while the first and the third switch Sw1, Sw3 are open (or the reverse, correspondingly), so that the current I flowing in coil L gradually drops off, i.e., recirculates, in correspondence to the interior resistance of coil L.

As long as the individual coils of the motor are controlled, for example with sine-wave-shaped running coil currents (wherein the individual coil currents exhibit a phase shift to each other that corresponds to the spatial offset of the motor coils around the rotor), phases of rising coil current amounts (i.e., during the first and third quadrants of the sine-wave-shaped coil current) and phases of falling coil current amounts (i.e., during the second and fourth quadrants of the sine-wave-shaped coil current) can be distinguished in the coils. Each of these current quadrants is subdivided and implemented through the chopper process into a suitable number of ON, FD and—if necessary—SD phases determined by the chopper frequency (i.e., the frequency with which the ON-FD-SD cycle is repeated as per FIG. 1), so that the de facto coil current follows a preset, generally sine-wave-shaped coil target current as precisely as possible.

As already mentioned above, however, with a 3-phase motor, generally it is not possible to independently control the individual coils of the motor, uncoupled from each other, thus to independently implement the three coil current phases shown in FIG. 1. Normally a 3-phase motor has three exterior motor connections U, V, W, which can be connected in various ways with the connections of the three motor coils, depending on whether these coils are designed as known star or triangular circuits or in another way.

Independent of this internal motor circuitry, with the invention-specific method or the invention-specific circuit assembly, it is not the individual motor coils, but the available external connections U, V, W of the motor that are thus switched in such a way and impinged on by current by the above-described chopper method, so that by means of the ON, FD and—if necessary—SD phases, the desired or preset motor target currents IsU, IsV, IsW are produced at these three external connections U, V, W, which in turn determine the r.p.m. and the rotational direction of the motor.

The invention-specific principle with which the three above-mentioned coil current phases ON. FD and—if necessary—SD are implemented for a 3-phase motor, is now explained with the aid of FIG. 2.

Figure 2A:
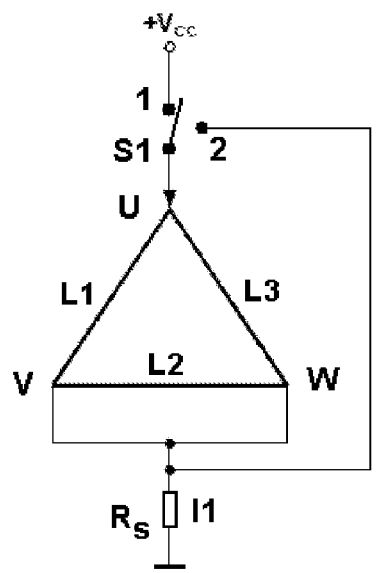
Figure 2B:
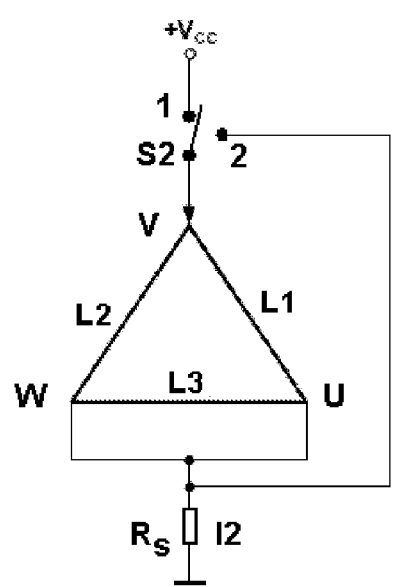
Figure 2C:
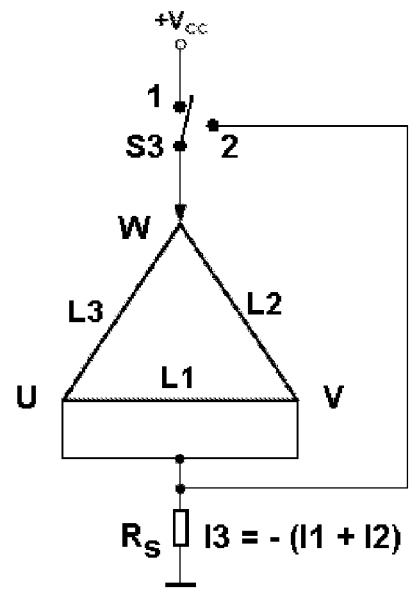

FIGS. 2(A), 2(B) and 2(C) schematically show a 3-phase motor with three external motor connections U, V, W and three motor coils L1, L2, L3, that here are switched in a triangular circuit. As was already mentioned above, this figure also holds true for a star circuit or another internal circuitry of the motor coils, since the triangular circuit may be viewed as a replacement connection diagram for a star or other circuitry.

To simplify the explanations to follow it is assumed that between the first and the second motor connection U, V a first coil L1; between the second and third motor connection V, W a second coil L2; and between the third and first motor connection W, U a third coil L3 of the motor is found.

FIG. 2(A) shows a first chopper phase, in which the first motor connection U is connected via a first switch S1 with the (positive) supply voltage Vcc and the second and third motor connection V, W are connected with each other and via a measurement resistor Rs are applied to ground or to a reference potential. With this, between the supply voltage Vcc and ground, a first current I1 flows. If the first switch S1 is shifted out of the depicted first switch setting 1 into the second switch setting 2, then the first motor connection U is disengaged from the supply voltage Vcc and connected with the other two motor connections V, W.

FIG. 2(B) shows a second chopper phase in which the second motor connection V is connected via a second switch S2 with the supply voltage Vcc and the first and the third motor connection U, W are connected with each other and via a measurement resistor Rs are applied to ground or to a reference potential, with a second current I2 flowing between the supply voltage Vcc and ground. By shifting the second switch S2 out of the depicted first switch setting 1 into the second switch setting 2, the second motor connection V is disengaged from the supply voltage Vcc and connected with the other two motor connections U, W.

FIG. 2(C) shows a third chopper phase in which the third motor connection W is connected via a third switch S3 with the supply voltage Vcc, while the first and the second motor connection U, V are connected with each other and via a measurement resistor Rs are applied to ground or to a reference potential, so that between the supply voltage Vcc and ground, a third current I3 flows. Here also by shifting the third switch S3 out of the depicted first switch setting 1 into the second switch setting 2, the third motor connection W is disengaged from the supply voltage Vcc and connected with the other two motor connections U, V.

The sum of these three currents I1, I2, I3 is zero, since no additional motor coil connections are present. Thus, always only two of the three currents need to be adjusted or controlled in the invention-specific manner, since the third current I3, for example, at $I3=-(I1+I2)$. Thus with this also a negative current (in the third and fourth quadrants in the case of sine-wave-shaped coil currents) can be controlled by appropriate adjustment of the two other currents with the ON and FD motor current phases explained in what follows.

As an alternative to the circuitry shown in FIG. 2, it would also be possible (though involving a greater circuit complexity) to generate a negative current from one of the motor connections by the other two motor connections linked with one another being connected with the positive supply voltage Vcc and the third motor connection in question with ground.

In a case where the first, second and third switch S1, S2, S3 are each in the depicted first switching setting 1, during the first, second and third chopper phase an invention-specific ON or FD phase of the motor (motor current phase) can be implemented. These motor current phases are defined in the same way as the coil current phases explained above with reference to FIG. 1, wherein an invention-specific SD phase is implemented by shifting one of switches S1, S2, S3 into the second switching setting 2, which all three motor connections U, V, W are connected with each other or to ground via the measurement resistance Rs.

The invention-specific ON, FD and SD phases are designated in what follows as motor current phases or exterior (ON, FD and SD) phases as distinct from the coil current phases explained in FIG. 1 or internal (ON, FD, and SD) phases (because related to the individual motor coils).

An ON motor current phase or exterior ON phase is thus present it via the chopper process in the manner known per se, in the first, second or third motor connection U, V, W a current is injected, the direction of which coincides with the instantaneous preset polarity or flow direction of the motor target current for this connection.

Correspondingly an FD motor current phase or external FD phase is provided when, via the chopper process, in a manner known per se, via the first, second or third motor connection U, V, W a feedback of the coil current into the voltate supply takes place, thus counter to the direction of the preset polarity or flow direction of the motor target current for this connection.

If lastly, one of the three switches S1, S2, S3 is shifted out of the first into the second switch setting 2, then the motor is in an SD motor current phase or external SD phase.

The ON and FD coil current phases described with reference to FIG. 1 are thus replaced for the invention-specific motor current control by the motor current phases ON and FD during least during two of the three chopper phases as per FIG. 2, i.e., implemented at at least two of the three motor connections U, V, W, during at least two of the three cyclically alternating activated chopper phases. Thus, corresponding to the three motor connections U, V, W, there exists a maximum of three different chopper phases, during which the motor can be run in an (external) ON or an FD phase (switch setting 1).

Together with the still-possible SD phases (switching settings 2) thus overall a maximum of seven different motor current phases (namely ON and FD at each motor connection U, V, W and an SD phase between each two chopper phases at which all the motor connections U, V, W are connected with each other) is possible.

For the sake of completeness it should be mentioned that during each motor current phase, the motor coils, depending on their interior circuitry, are also in a certain coil current phase. With the designation and circuitry of the coils according to FIG. 2, the result is that during the first chopper phase as per FIG. 2(A), the second coil L2; during the second chopper phase as per FIG. 2(b) the third coil L3; and during the third chopper phase as per FIG. 2(C) the first coil L1, is in an SD coil current phase, since these coils or the motor connections in question are short-circuited. In addition, during each of the three chopper phases, the particular two other coils are in an ON or an FD coil current phase.

The sequence of activation of the three chopper phases as per FIGS. 2(A), 2(B) and 2(C), i.e., the direction in which these are activated in cyclically alternating fashion, is preferably chosen in agreement with the direction of motor rotation, even at high r.p.m. to ensure a sensible sequence which does not act counter to the rotation of the motor. In this way, a symmetry of control is attained that is independent of rotational direction.

Preferably one chopper phase switches over to a following chopper phase at a frequency that is considerably higher as compared to the frequency of the sine-wave-shaped target currents IsU, IsV, IsW, so that the motor currents I1, I2, I3 injected through the chopper phases correspond as exactly as possible to the target currents IsU, IsV, IsW. So that this is ensured even at high motor r.p.m., and thus ensuring a correspondingly high frequency of the target currents IsU, IsV, IsW, the supply voltage Vcc must be sufficiently high so that the motor currents I1, I2, I3 during the particular chopper phase are attained appropriately quickly. In the FIG. 3 example, this switchover frequency is at multiples of 10 kHz.

During the chopper phases as well if necessary as the SD phases between two chopper phases, the motor current phases (ON, FD) are temporally activated, dimensioned, and combined through the chopper process in a manner known per se, so that the particular de facto motor current I1, I2 and I3 during the particular chopper phase, and thus also the particular motor current over its entire (for example sine-wave-shaped) course, thus during the rising and falling current phases of both polarities, follows as precisely and temporally closely the particular motor target current IsU, IsV, and IsW, wherein it is to be considered that the sum of the three currents I1, I2 and I3 be zero at least in essence. Preferably during a chopper phase, via the chopper process, only one motor current phase (thus either an external ON or an external FD phase) is activated. Additionally it is preferred that one chopper phase is terminated and the next chopper phase be activated when the motor current phase is terminated in the chopper phase in question via the chopper process.

The frequencies, amplitudes and phases of the motor target currents IsU, IsV, IsW are generated in a known manner, among other things according to the desired r.p.m. and rotational direction of the motor as well as certain motor parameters, etc. and supplied to the invention-specific circuit assembly.

For example, this means that the first chopper phase shown in FIG. 2(A) is terminated and it is switched to the second chopper phase as per FIG. 2(B), when the first motor current I1 at motor connection U has attained the instantaneous target current IsU at least in essence (i.e., in correspondence to the known criteria for termination of an ON or FD phase). Correspondingly, the second chopper phase shown in FIG. 2(B) is terminated and it is switched to the third chopper phase as per FIG. 2(C), when the second motor current I2 at motor connection V has attained the instantaneous target current IsV at least in essence (i.e., as above) Finally, the third chopper phase shown in FIG. 2(C) is terminated and it is again switched to the first chopper phase, when the third motor current I3 at motor connection W has attained the instantaneous target current IsW at least in essence (i.e., as above). This notwithstanding, there remains the possibility that through the chopper process, in a manner known per se, between two chopper phases an SD phase as per the above explanation can still be activated, i.e. by shifting one of the three switches S1, S2, S3 from the first switching position 1 into the second switching position 2.

Figure 3:
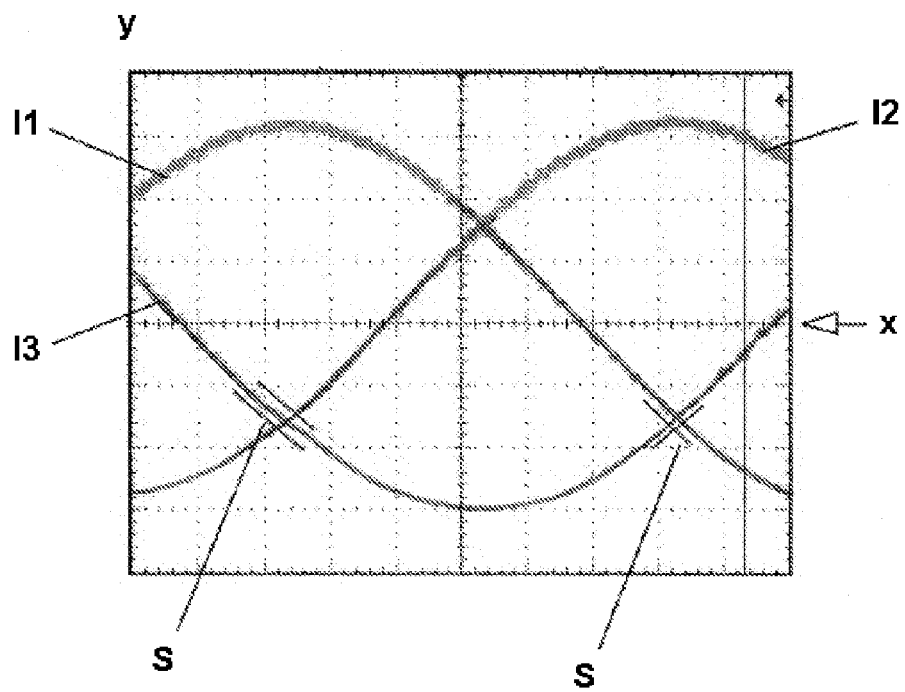

For a brief temporal segment, FIG. 3 is an example of the sequences of the voltages dropping at the measuring resistance Rs and thus of the sequences of the three motor currents I1, I2, I3 at the three motor connections U, V and W.

The width of the three curve sequences of motor currents I1, I2, I3 shown in FIG. 3 provide an indication of the dropping of motor currents during the two (other) chopper phases, while that of the particular motor current is not controlled at the moment. Based on FIG. 2, this means that for example the width of the curve progression of the first motor current I1, is due to the drop in this first motor current I1 during the second and third chopper phase as per FIGS. 2(B) and 2(C). The same holds true for the drop in the second motor current I2 during the first and third chopper phase as well as the drop in the third motor current I3 during the first and second chopper phase.

Essentially this drop is caused by the particular internal motor resistance, and is therefore proportional to the amount of the particular motor current, i.e. in the area of its zero crossing (i.e., here along the axis marked with an x) it is smaller than in the area of its maximum amplitude.

Additionally, the motor current sequences each show slight distortions at the points where two motor currents cross (of which two are marked with an "S" in FIG. 3).

This may have several causes. For one, the switching transistors by which the chopper phases are switched, have a finite internal resistance, which especially in an instance in which between two chopper phases an external SD phase (switching position 2 in FIG. 2) is switched, can lead to a coupling of the three motor currents I1, I2, I3.

For another, the motor current drops of during the exterior SD phases due to the short circuit of the motor and thus also of the motor coils, as well as their finite internal resistance in a manner not controlled by the chopper algorithm, which likewise can result in a coupling of motor currents I1, I2, I3.

Lastly, the motor current sequences are also coupled with each other, slightly over the mutually influenced lengths of the particular chopper phases. The reason for this coupling is that in an instance in which a chopper phase is relatively long, also one of the three motor coils is in the SD coil current phase for this relatively long duration, and the current in this coil correspondingly drops off more, so that the next chopper phase in which this coil is run in the ON phase, possibly must be correspondingly longer, i.e., depending on how high the instantaneous motor current target value is.

Overall, one or more of these effects can lead to a certain coupling of two motor currents at their crossing point S, which results in a distortion, especially a flattening and a partially parallel sequence of the two motor currents. Even if this effect is scarcely detectable in a real environment as shown in FIG. 3, it nevertheless can be a perceptible drawback to the running o the motor, since every deviation from the ideal motor current form can excite resonances.

To avoid these distortions, according to a preferred embodiment form of the invention, the supplied, signed motor target current IsU, IsV, IsW for the first, second and third motor connection U, V, W, is increased by a hysteresis, i.e. in the case of a positive current value (i.e., during the first and second quadrants with a sine-wave-shaped current) increased in the direction of the positive polarity and in the case of a negative value (i.e., during the third and fourth quadrants with a sine-wave-shaped current) reduced by this hysteresis in the positive direction, so that the three chopper phases shown in FIG. 2 are only terminated when the particular de facto instantaneous motor current I1, I2, I3 has attained the instantaneous amount value of the target current IsU, IsV, IsW, plus or minus the hysteresis value, and thus, in terms of amount is somewhat higher or lower than the amount of the value of the target current in question. The hysteresis is chosen so that the average de facto motor current I1, I2, I3 at each motor connection U, V and W, as a result of the dropping (directed in the opposite direction) of the current amounts during the external SD phases (i.e., switching setting 2 in FIG. 2) on average corresponds to the desired target values IsU, IsV, IsW.

In other words, thus for example in the case in which during a chopper phase as per FIG. 2 (i.e., switching setting 1) a positive motor current is fed into a motor connection, this current is controlled at a value corresponding to the hysteresis above the target value in question. If this same motor current at a later time has a negative value and in turn the chopper phase in question is activated, then the current is controlled to a value reduced in amount by the hysteresis below the target value in question.

What is achieved in this way is that the mutual influence of the motor currents is less strongly emphasized, so that the average motor current I1, I2, I3 at each motor connection U, V, W, can thereby follow the preset target current IsU, IsV, IsW with considerably greater precision.

Primarily with the SD motor current phases (switching settings 2 in FIG. 2), the frequency of the three chopper phases (chopper frequency) shown in FIG. 2(A), (B), (C) can be reduced, so that it is also more independent of the hysteresis adjustment. The chopper frequency can also be reduced by increasing the hysteresis. True, care should possibly be taken in this not to reduce the chopper frequency so drastically that it gets into the audible range.

Figure 4:
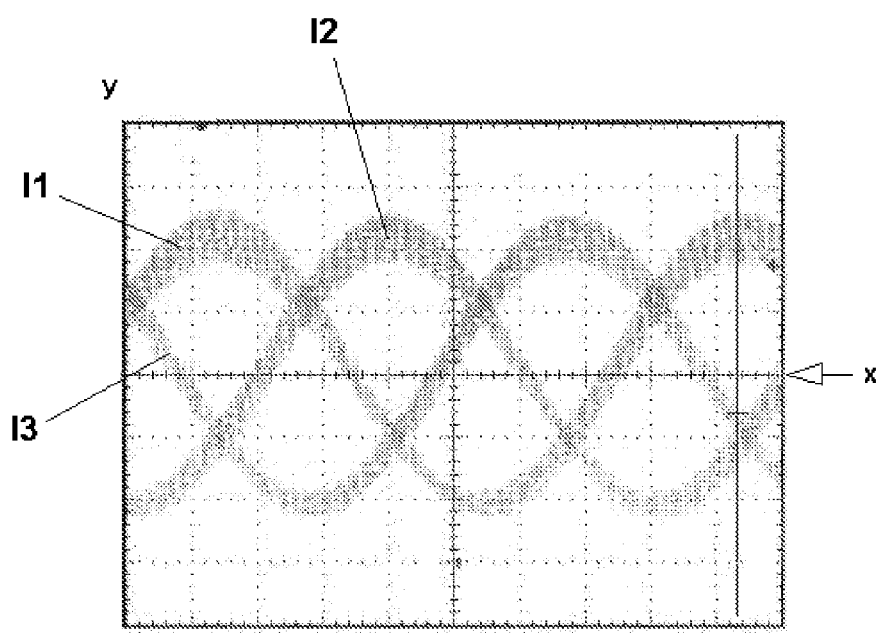

FIG. 4 shows the progressions of voltages dropping at the measurement resistance Rs for a brief temporal segment, and thus the progressions of the currents I1, I2, I3 at the three motor connections U, V and W, when employing such a hysteresis. As compared to FIG. 3, the widths of the three current curve progressions are in fact considerably greater due to the hysteresis, but the average values of these current curve progressions have been considerably better approximated to the ideal sine-wave shape.

Figure 5:
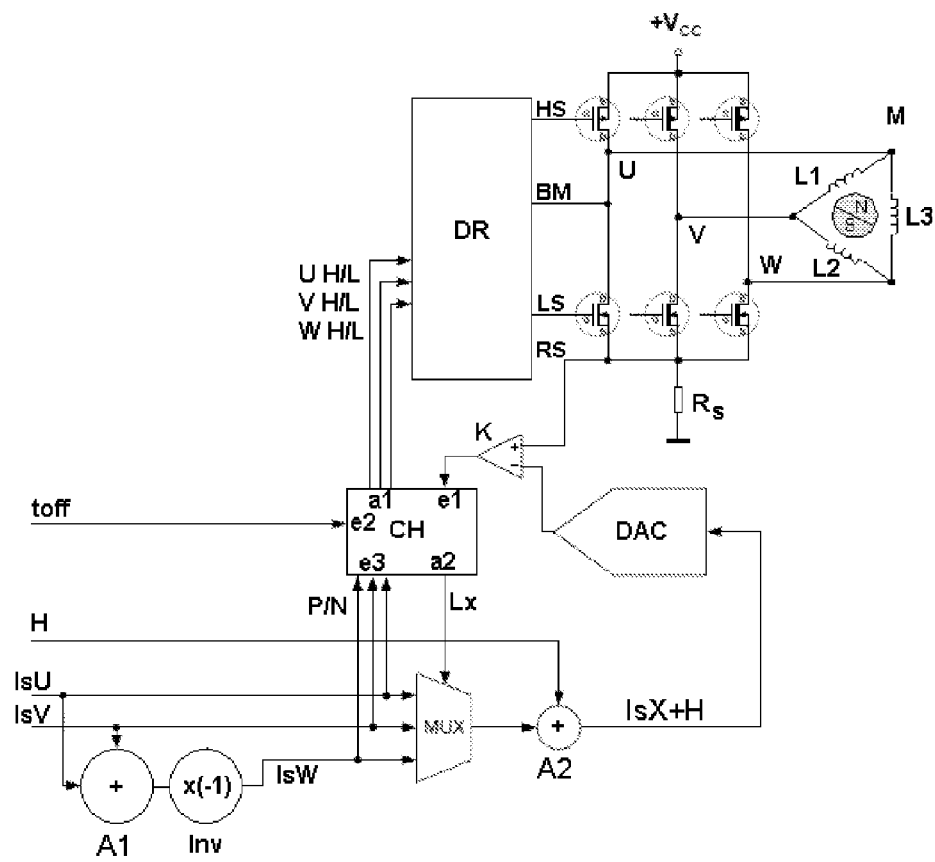

Lastly, FIG. 5 shows a block diagram of a preferred circuit assembly for implementation of the invention-specific, method. This circuit assembly comprises as components known per se a driver circuit DR, by which, via high-side (HS) and low-side (LS) outputs and a BM (bridge middle point), a bridge circuit with switching transistors not shown is controlled, by which via PWM control the connections U, V, W of a three-phase motor M according to the depiction in FIG. 2 and the explanations in this regard above of the three chopper phases (switching settings 1 in FIG. 2), are cyclically connected with the supply voltage Vcc and via measurement resistance Rs to ground, and by which if necessary the external SD phases (switching setting 2 in FIG. 2) are activated by connection of all three motor connections to ground.

As was already mentioned above, the de facto current I1, I2, I3 flowing into or out of the particular motor connection U, V, W connected with supply voltage Vcc and through motor M is preferably detected by means of the measurement resistance Rs (and the voltage dropping at it thereby) at the foot point of the bridge circuits.

One chopper phase is shifted to a following chopper phase in which one of the motor connections U, V, W, is connected with the supply voltage Vcc and the other two connections are short-circuited and are connected via the measurement resistance Rs to ground, with digital switching signals U H/L, V H/L, W H/L, which are generated by a chopper and supplied to a driver circuit DR. These switching signals designate the directions H, L (positive, negative) in which the currents I1, I2, I3 are to be increased or reduced at motor connections U, V and W, to attain the particular target currents plus the hysteresis.

The external SD phases are activated via a signal supplied to a (second) input e2 of chopper CH for adjusting a $t_{OFF}$ time of the chopper, during which the chopper by way of the driver circuit sets all the motor connections U, V, W to ground.

The voltage dropping at measurement resistance Rs, positive or negative depending on the current direction, is fed to a first input of a comparator K, at the second input of which the output of a digital-to-analog converter DAC is applied, by which the desired current values the target current values IsU, IsV, IsW at the motor connections plus the hysteresis as explained above) which are generated preferably at the digital level as described below, are convened into analog values; the desired current values could also be generated by analog signal processing, and then naturally the digital-to-analog converter DAC is superfluous. Then, at the first output a1, the chopper CH, in dependence on the output signal of comparator K, generates digital signals U H/L, V H/L, W H/L fed to the driver circuit DR, for switching the chopper phases or the (external) SD phases as per FIG. 2 in such a way that the particular de facto motor current progression I1, I2, I3 according to the above description and as depicted in FIG. 4, corresponds to the preset target current progression IsU, IsV, IsW in question.

Alternative and analogous to the depicted detection by means of a comparator K, the de facto motor currents I1, I2, I3 can also be detected via an ADC (analog-to-digital converter), to undertake the signal processing totally at the digital level.

Along with a first input e1 for the output signal of comparator K, chopper CH exhibits a second input e2 for optional adjustment of the $t_{OFF}$ time of the chopper, and a third input e3 for a preset instantaneous direction P/N (polarity) of the target coil currents IsU, IsV, IsW. Via the third input e3, reversal of these polarities is detected, to synchronize the chopper activity with the polarity alterations, by which beat frequencies at high r.p.m. are avoided.

At a second output a2 of chopper CH, a switching signal Lx is applied to switch a multiplexer MUX. To the inputs of multiplexer MUX the target motor currents IsU, IsV, IsW are supplied, wherein, as was explained above, one of the three motor currents results through addition of the two other motor currents and inversion of the sum of them. For this purpose, a first adder A1 as well as an inverter Inv is provided. With switching signal Lx, the multiplexer MUX for selection of one of the three target motor currents IsU, IsV, IsW and thus for selection of the chopper phases as per FIG. 2 is cyclically switched over, and in fact when, as was explained above with reference to FIG. 2, the particular instantaneous motor current I1; I2; I3 has attained the instantaneous target motor current IsU; IsV; IsV in question, plus the hysteresis as explained above.

In addition the circuit assembly exhibits a second adder A2, with which an instantaneous (digital) target value of the motor current IsU, IsV, IsW, supplied via multiplexer MUX, is preferably impinged on by an added hysteresis H.

The instantaneous digital target values of motor currents IsU, IsV, IsW plus the hysteresis H are then supplied to the input of the digital-to-analog converter DAC, to generate therefrom the instantaneous analog target values of the motor currents plus the hysteresis, which are supplied to the second input of comparator K for comparison with the measured instantaneous motor current values I1, I2, I3.

As was already mentioned, in dependence on the output signal of comparator K, the chopper CH then generates the digital switching signals U H/L, V H/L, W H/L for the driver DR, so that the driver DR impinges on the motor connection U, V, W, in question via a PWM control with the supply voltage Vcc, and terminates the chopper phase in question, when the output signal of comparator K is essentially zero and thus the de facto motor current at the motor connection U, V, W in question coincides with the pertinent target current IsU, IsV, IsW. For this purpose, during at least two of the three chopper phases, as was described above with reference to FIG. 2, the motor current phases ON and FD, and if necessary SD, are activated, dimensioned, and combined in a manner determined by the chopper algorithm. If the motor current is controlled only during two of the three chopper phases by means of the ON or FD motor current phases, what results, as indicated by example in FIG. 2, is motor current I3 during the third chopper phase from the first and the second motor current I1, I2.

The chopper phases switch, i.e. shift between the particular motor connections U, V, W by means of the switching, signals U H/L, V H/L, W H/L in synchronism with the selection of the motor target current IsU, IsV, IsW by means of switching signal Lx via multiplexer MUX, with the frequency of this switching, as was explained above, being markedly higher than the frequency of the motor target currents IsU, IsV, IsW.

Alternative to or in addition to the above-mentioned addition of the hysteresis value, by means of the second adder A2, the target current values can also be generated by wiring of comparator K in such a way that it exhibits a corresponding hysteresis when the target current values are compared with the de facto current values.

The chopper phases explained above, the ON, FD and SD motor current phases as well as the other sequences described further above, can naturally also be implemented in a corresponding way in motors with more than three phases.

The invention claimed is:

1. Method for controlling the motor current in an electrical 3-phase motor, with a first, a second and a third motor connection, comprising
　activating a first, a second and a third chopper phase in cyclically alternating fashion, wherein during each chopper phase the motor is connected between a supply voltage and ground, namely with one of the first, the second and the third motor connection and with two other motor connections of the first, the second and the third motor connection which are connected with each other, and
　injecting, during at least two of the three chopper phases, a target current supplied for the one of the first, second, and third motor connection into the one of the first, second, or third motor connection by a chopper process, and
　comparing, during each chopper phase, a supplied instantaneous motor target current for the one motor connection with a de facto instantaneous motor current at this motor connection, and activating, dimensioning, and combining through the chopper process, in dependence on a difference between these two currents, ON and FD motor current phases so that the de facto motor current follows the motor target current.

2. Method according to claim 1, comprising connecting, during a chopper phase, either the one of the first, second and third motor connection with a supply voltage and the other two motor connections with each other to ground, or the one of the first, second and third motor connection to ground and the other two motor connections connected to each other with the supply voltage.

3. Method according to claim 1, activating between two chopper phases an SD motor current phase by all three motor connections being connected with each other.

4. Method according to claim 1, activating, during a chopper phase, only one motor current phase.

5. Method according to claim 4, terminating a chopper phase and activating a next chopper phase when a motor current phase in the chopper phase is terminated by the chopper process.

6. Method according to claim 1, wherein a frequency of switching from one chopper phase to the next is higher than a frequency of the supplied motor target currents.

7. Method according to claim 1, wherein a sequence of activating the three chopper phases is chosen to coincide with a rotational direction of the motor.

8. Method according to claim 1, comprising increasing the supplied instantaneous motor target current by a preset hysteresis before it is compared with the de facto instantaneous motor current.

9. Circuit assembly for controlling motor current in an electrical 3-phase motor with a first, a second and a third motor connection, comprising
　a driver circuit controlled by a chopper, by which driver circuit a cyclic alternating switching takes place between at least two chopper phases, wherein during each chopper phase, in one of the motor connections of the first, the second, and the third motor connection, by a chopper process, a motor current is injected which corresponds to a motor target current which is supplied for the one motor connection, wherein two other motor connections of the first, the second, and the third motor connections are connected with each other via the driver circuit; and
　a comparator with two inputs for comparing a de facto motor current with a supplied motor target current as well as an output that is connected with the chopper.

10. Circuit assembly according to claim 9, comprising a first adder and an inverter for adding and inverting a supplied first and second motor target current (IsU, IsV) for generating the third motor target current (IsW) according to the formula IsW=−(IsU+IsV).

11. Circuit assembly according to claim 9, comprising a multiplexer with three inputs, to which the first, the second and the third motor target current (IsU, IsV, IsW) are applied, as well as an output, which is connected to one of the inputs by means of a chopper switching signal for switching between the chopper phases.

12. Circuit assembly according to claim 9, comprising a second adder for adding a hysteresis value to the supplied motor target currents.

13. Circuit assembly according to claim 9, wherein, by the driver circuit controlled by the chopper, all three motor connections can be connected with each other between two chopper phases.

* * * * *